United States Patent
Spano

(10) Patent No.: US 9,382,639 B2
(45) Date of Patent: Jul. 5, 2016

(54) DEVICE AND METHOD FOR CRYSTALLIZING INORGANIC OR ORGANIC SUBSTANCES

(75) Inventor: Monika Spano, Charavines (FR)

(73) Assignee: UNIVERSITE JOSEPH FOURIER, Grenoble (FR)

( * ) Notice: Subject to any disclaimer, the term of this patent is extended or adjusted under 35 U.S.C. 154(b) by 588 days.

(21) Appl. No.: 13/821,053

(22) PCT Filed: Sep. 15, 2011

(86) PCT No.: PCT/FR2011/052121
§ 371 (c)(1),
(2), (4) Date: Apr. 11, 2013

(87) PCT Pub. No.: WO2012/035268
PCT Pub. Date: Mar. 22, 2012

(65) Prior Publication Data
US 2013/0199439 A1   Aug. 8, 2013

(30) Foreign Application Priority Data
Sep. 15, 2010 (FR) .................................... 10 57354

(51) Int. Cl.
*C30B 7/08* (2006.01)
*C30B 7/00* (2006.01)
*C30B 29/54* (2006.01)
*C30B 29/58* (2006.01)

(52) U.S. Cl.
CPC ... *C30B 7/08* (2013.01); *C30B 7/00* (2013.01); *C30B 29/54* (2013.01); *C30B 29/58* (2013.01); *Y10T 117/1004* (2015.01)

(58) Field of Classification Search
CPC ..................................... C30B 7/08; C30B 7/14
See application file for complete search history.

(56) References Cited

U.S. PATENT DOCUMENTS

| 6,596,081 B1* | 7/2003 | Arnowitz | B01D 1/00 117/201 |
| 2002/0145231 A1* | 10/2002 | Quake | B01D 9/00 264/267 |
| 2003/0233978 A1 | 12/2003 | Niimura et al. | |
| 2007/0025895 A1* | 2/2007 | Qin | B01D 9/00 422/245.1 |
| 2007/0169686 A1* | 7/2007 | Quake | B01D 9/00 117/14 |

FOREIGN PATENT DOCUMENTS

WO   WO 2004/029338 A1   4/2004
WO   WO 2006/099890 A1   9/2006

OTHER PUBLICATIONS

Ducruix et al., "Solubility Diagram Analysis and the Relative Effectiveness of Different Ions on Protein Crystal Growth," *Methods: A Companion to Methods in Enzymology*, vol. 1, No. 1, pp. 25-30, Aug. 1990.
Nov. 17, 2011 International Search Report issued in International Application No. PCT/FR2011/052121 (with translation).

* cited by examiner

*Primary Examiner* — Robert M Kunemund
(74) *Attorney, Agent, or Firm* — Oliff PLC

(57) ABSTRACT

A device for crystallizing a molecule to be crystallized, which includes: at least one crystallization cell that includes a crystallization chamber for receiving a first solution S1 containing the molecule to be crystallized and the crystal seeds thereof, a dialysis membrane, and a container to be filled with a second solution S2 that contains constituents selected from the group containing crystallization agents, additives and buffers; and at least one image acquisition means. The crystallization device is characterized in that it includes: at least one addition means arranged to add, to the container, constituents selected from the group containing crystallization agents, additives and buffers of solution S2; and/or at least one sampling means arranged to collect, from the container, all or a portion of solution S2. The invention also relates to a crystallization method.

18 Claims, 3 Drawing Sheets

DEVICE AND METHOD FOR CRYSTALLIZING INORGANIC OR ORGANIC SUBSTANCES

The present invention relates to the field of crystallization of inorganic or organic substances, and in particular to the crystallization of molecules, notably macromolecules, such as proteins.

Understanding the physicochemical properties of macromolecules such as proteins generally relies on knowing the atomic structure of these macromolecules.

In order to study this structure, one essentially resorts to X-ray diffraction and neutron crystallography techniques.

With X-ray diffraction, it is thus possible to obtain the three-dimensional structure of the molecules to be studied; with that of neutrons additional information may be obtained on the protonation states of the proteins and of their ligands, on the positions and on the orientations of the water molecules and on the networks of hydrogen bonds.

Indeed, in order to understand biological processes, it is important to accurately know the positioning of hydrogen atoms, how they are transferred between the protein molecules, the molecules of the solvent and the substrates.

These diffraction techniques require that the macromolecules to be studied be in crystalline form, and more advantageously in the form of high quality single crystals of sufficient volume.

Within the scope of the present invention, by a high quality single crystal is meant a single crystal having:
low mosaicity,
significant diffraction power (i.e. less than 2 angstroms),
a large volume, i.e. comprised between 0.001 $mm^3$ for X-ray diffraction and 1 $mm^3$ for neutron diffraction.

Also, within the scope of the present invention, by macromolecules are meant molecules having a molecular weight of several thousand daltons to several hundred thousand daltons. These may be sequences of DNA or RNA nucleic acids, virus fragments, proteins, protein complexes, protein-RNA complexes, protein-ligand complexes, or further polypeptides.

Further, the present invention may be successfully applied to the crystallization of smaller molecules such as sugars, antibiotics or further other compounds of pharmaceutical interest.

In order to obtain high quality single crystals of large volume, it is essential to control the crystallization of the macromolecules (i.e. crystallagonesis), since it is crystallogenesis which will control the physicochemical properties of the thereby obtained crystal.

Crystallogenesis is broken down into two steps:
a first step, a so-called nucleation step consisting in the occurrence of crystalline seeds from a crystallization solution.
a second step, a so-called growth step, consisting in the crystalline growth of seeds of crystals obtained during nucleation.

Nucleation may be perturbed by the occurrence:
of an undesirable solid or liquid phase, for example an amorphous precipitate or a demixing (a liquid-liquid separation), or
an undesirable crystalline/polymorphous phase.

Polymorphism is the capability of a molecule of existing in several crystalline forms. Now, in the pharmaceutical field, the approval for standardization of a drug is often subject to the requirement of a single crystalline form or single polymorph of a given molecule.

Growth may result in the formation of crystals with low diffraction, or even in the formation of polycrystals, which seriously hampers resolution of the three-dimensional structure of macromolecules.

In order to avoid these aforementioned problems, long and costly research work gives the possibility of obtaining optimum conditions for crystallization of macromolecules.

To do this, it is essential to know:
the behavior of the molecules in solution before nucleation, i.e. the nature of their (attractive/repulsive) interactions, the molecular associations: the size and mass parameters of the particles formed in solution (monomer, dimer, . . . ), the polydispersity (i.e. the presence of one or several populations of particles formed in solution);
the behavior of the crystalline seeds once they are formed and present in a solution of the molecule to be crystallized, and this according to different parameters which are:
a) the temperature,
b) the concentration of the molecule to be crystallized,
c) the concentration of the crystallization agents and/or additives and their nature.

Within the scope of the present invention, by crystallization agent is meant agents which promote crystallization of the molecule to be crystallized. These may be:
salts, such as ammonium sulfate, sodium chloride, potassium phosphate;
organic compounds, such as isopropanol and 2-methyl-2, 4-pentanedial (MPD);
polyethylene glycols, such as PEG 4000, PEG 6000 or further PEG 8000.

Within the scope of the present invention, by additive is meant constituents which allow increase in the stability of the molecule to be crystallized and/or homogeneity of its conformation. These may be detergents, reducing agents, substrates, and co-factors such as n-alkyl-β-glucosides or n-alkyl-maltosides, dithiotreitol (DTT), lipids, sub-units or prosthetic groups.

Within the scope of the present invention, by buffer is meant a constituent allowing a set pH to be maintained in a solution into which it has been added. This may be 2-(N-Morpholino)Ethane-Sulfonic acid (abbreviated as <<MES>> hereafter), 2-amino-2-hydroxymethyl-1,3-propanediol (abbreviated as <<tris>> hereafter), 2-(Bis(2-hydroxyethyl) amino)acetic acid (abbreviated as <<Bicine>>), 4-(2-hydroxyethyl)-1-piperazine ethane sulfonic acid (abbreviated as <<Hepes>>), or sodium citrate, sodium acetate or further sodium cacodylate.

It is often necessary to produce a phase diagram of the molecule to be crystallized which is established as a function of these three aforementioned parameters a) to c).

An exemplary phase diagram is illustrated in FIG. 1a for the case of a molecule to be crystallized having direct solubility.

By a molecule to be crystallized having direct solubility, is meant that the solubility of the molecule to be crystallized increases with the increase in the temperature).

The temperature appears (expressed in ° C.) on the axis of the abscissas of this diagram, and the concentration of the molecule to be crystallized present in solution (expressed in mg/mL) appears on the axis of the ordinates, Four zones A to D are distinguished on this diagram, which are established and determined by observation (for example by means of an optical microscope) in real time of the development of the contents of the solution of the molecule to be crystallized, in which seeds of crystals of the molecule to be crystallized have been placed:

Zone A: The metastable zone, in which the solution is slightly oversaturated, and may thus be maintained for a very long time without any formation of crystals, but the crystals sown grow therein;

Zone B: Nucleation does not occur and the sown crystals are dissolved: this is the so-called <<oversaturation zone>>;

Zone C: The excess of the molecule to be crystallized separates from the solution of the molecule to be crystallized in the form of crystal seeds (or in other words nuclei). The sown crystals grow therein: it is a zone in which nucleation is spontaneous.

Zone D: The formed structures are disordered. These are aggregates and/or precipitates. This zone is said to be a <<precipitation zone>>, in which oversaturation is so large that formation of aggregates and of precipitates is promoted therein before formation of the crystals.

The zones A, C and D form together the so-called <<oversaturation zone>>.

The metastable zone is limited by two curves of different natures.

The lower boundary (i.e. the boundary between zone A and zone B), is a solubility curve, corresponding to the thermodynamic equilibrium points between the solution of the molecule to be crystallized and the crystals. The location of this solubility curve on the phase diagram is fixed and is of thermodynamic nature. A solution to be crystallized located on this solubility curve remains stable. On this solubility curve, the probability of the occurrence of a nucleation event is zero and the time for inducing nucleation is infinite.

The upper limit of the metastable zone (i.e. the boundary between zone A and zone C) is thus designated as <<metastability limit>> or <<super solubility curve>>.

Unlike the solubility curve, its location on the phase diagram is of a kinetic nature. It depends on the rate of progression of oversaturation.

On this super solubility curve, the probability of the occurrence of a nucleation event is 1, and the time for inducing nucleation is zero since nucleation is instantaneous.

As the time for inducing nucleation depends on oversaturation, any solution to be crystallized located in the metastable zone of the phase diagram may spontaneously nucleate. The higher the oversaturation, the shorter is the time for inducing nucleation.

Another phase diagram of the molecule to be crystallized may be established versus the concentration of the molecule to be crystallized (axis of ordinates) and versus the concentration of the crystallization agent and/or additive (axis of abscissas). Such an exemplary diagram is illustrated in FIG. 1b. The same four zones A-D as described for FIG. 1a, may be seen therein.

The determination of the solubility curve of different molecules to be crystallized has been the subject of many studies, among which mention may be made of that of A. F. Ducruix, M. M. Ries-Kault, Methods (1990), 1(1) 25-30 entitled <<Solubility diagram analysis and the relative effectiveness of different ions on protein crystal growth>>.

There exist several crystallization techniques, among which
  steam diffusion (as a hanging, sitting or sandwiched drop),
  dialysis,
  free interface diffusion, or further
  batch: a crystallization technique wherein the molecule to be crystallized is mixed with crystallization agents and/or suitable additives, thereby generating a homogeneous solution.

The batch technique is widely used for crystallization of small molecules, because of its rapidity and of its simplicity to apply. However, only a narrow range of concentrations of the molecule to be crystallized, as well as of the crystallization agent may be sampled during a same experiment so as to provide operating conditions with which nucleation and/or growth of the crystal may be promoted.

In this respect, document WO 2006/099890 A1 describes a batch crystallization method for a macromolecule based on a systematic temperature control of the solution of the macromolecule to be crystallized in which crystals of said macromolecule has been placed, so that the crystals are always located in the metastable zone, and this so that during controlled time-dependent change in the temperature of the solution of the macromolecule to be crystallized, the crystals develop and grow.

Nevertheless, this crystallization method is exclusively limited to the control:
  of a single crystallization parameter which is temperature,
    of one of the two crucial steps for crystallization, i.e. the growth of crystals sown in the solution of the macromolecule to be crystallized.

Further, the crystals obtained at the end of this crystallization method cannot be recovered with traditional methods, such as the mounting of crystals in loops used in crystallography. In order to facilitate extraction of the crystals, a micromanipulator is used in order to mount the crystals in quartz capillaries.

Crystallization by dialysis involves the setting up of the molecule to be crystallized in a device which is sealed by means of a dialysis membrane. This then allows water, crystallization agents, additives or further buffers, to diffuse on either side of the dialysis membrane while retaining the molecule to be crystallized in the device. The device is placed in a suitable container which contains crystallization agents, additives and buffers. This technique by dialysis also takes into account both <<salting in>> effects (with low ionic force, the solubility of the molecule to be crystallized increases when the ionic force increases) and <<salting out>> effects (with high ionic force, the solubility of the molecule to be crystallized decreases when the ionic force increases) and the pH.

In this respect, document WO 2004/029338 A1 describes an apparatus for crystallization by dialysis which comprises a crystallization chamber which is placed in a container and in which a cavity is made, intended to contain the crystallization sample. A dialysis membrane is sealably positioned on the crystallization chamber. The container comprises a means giving the possibility of putting the membrane in contact or not with a solution which contains crystallization agents at a defined concentration.

As this is described in document WO 2004/029338 A1, the crystallization operations may occur simultaneously in parallel in several crystallization cells. The crystallization device in this document WO 2004/029338 A1 is not designed for conducting in series in a same crystallization cell, crystallization experiments by varying the composition of the crystallization solution.

Thus, according to the prior art as recalled above, concerning crystallization techniques, a crystallization device has never been developed, in which the composition of the crystallization solution is controllably varied during the crystallization process so as to create in series in a same crystallization cell, quite varied crystallization conditions for a same sample containing the molecule to be crystallized and therefore causing its development during crystallization.

The present invention proposes the provision of a crystallization device, in which crystallization is applied according to a quite innovative approach, i.e. by controllably and varying in situ the composition of the crystallization solution. This gives the advantage of improving crystallization. Indeed, by means of the crystallization device according to the invention, crystals of excellent quality, of large volume and of the desired crystalline/polymorphous phase are obtained.

This quite innovative application of crystallization also has the benefit of requiring a reduced volume of the molecule to be crystallized used in a single experiment, as compared with conventional crystallization techniques with the possibility of reusing it subsequently. Indeed, the sample is not consumed during crystallization and the crystallization conditions may be changed reversibly.

Thus, a first object of the invention is a device for crystallization of a molecule to be crystallized comprising:
  at least one crystallization cell, the crystallization cell comprising:
    a crystallization chamber, in which is made a cavity intended to receive a first solution S1 containing the molecule to be crystallized and its crystal seeds, and optionally at least one buffer, the cavity including an optical bottom and an aperture facing the optical bottom,
    a dialysis membrane intended to cover the aperture of the cavity of the crystallization chamber,
    a reservoir intended to be fitted onto the crystallization chamber, so as to create a sealed compartment formed by the reservoir on the one hand and by the crystallization chamber on the other hand, the compartment being intended to be filled with a second solution S2, a so-called crystallization solution which contains constituents selected from the group formed by crystallization agents, additives and buffers,
  at least one means for acquiring images,
said crystallization device being characterized in that it comprises:
  at least one addition means laid out so as to add into the reservoir, constituents selected from the group formed by crystallization agents, additives and buffers to the solution S2
  and/or
  at least one sampling means laid out for sampling all or part of the solution S2 in the reservoir.

Thanks to the addition means and/or the sampling means, the nature of the constituents which the solution S2 contains (crystallization agents, additives, buffers) as well as the concentration of these constituents, may vary during crystallization.

The composition of the solution S2 may be accurately adjusted by the operator who conducts the crystallization. In order to decide on the variations on the composition of the solution S2, the operator notably refers to physicochemical concepts determined according to the phase diagrams of the molecule to be crystallized, as mentioned above.

Thus, the reservoir of the crystallization cell is built as a continuous flow cell.

By means of the crystallization device according to the invention, optimization of the nucleation and of the crystal growth may be obtained by combining a dialysis method with specific variations of temperature and of composition of the solution S2 which are decided by the operator from controls of the parameters of the crystallization (temperature, concentration of the molecule to be crystallized and composition of the solution S2) carried out during crystallization.

The addition means may consist in a driving means, a so-called <<addition driving means>> which is laid out for adding in the reservoir constituents selected from the group formed by crystallization agents, additives and buffers, to the solution S2.

The sampling means may consist in a driving means a so-called <<sampling driving means>> which is laid out for sampling all or part of the solution S2 in the reservoir.

In an embodiment, the addition means consists in a multichannel peristaltic pump.

More specifically, the multichannel peristaltic pump may comprise:
  a plurality of channels, so-called <<secondary channels>>, which are each immersed in a reservoir of a storage solution $S_I$ containing constituents selected from the group formed by crystallization agents, additives and buffers. The solutions $S_i$ may contain different constituents, but also identical constituents, optionally with different concentrations;
  a channel, a so-called <<addition channel>> which connects the plurality of secondary channels to the reservoir, so as to add the crystallization agents, the additives and the buffers of the solutions $S_i$ in the reservoir.

In another embodiment of the invention, the sampling means consists in a peristaltic pump which comprises a channel, a so-called <<sampling channel>>, in which circulates all or part of the solution S2 which was sampled from the reservoir.

In another embodiment of the invention, the addition means and the sampling means consist in a multichannel peristaltic pump. In this embodiment, the multichannel peristaltic pump may comprise:
  a plurality of channels, so-called <<secondary channels>>, which are each immersed in a reservoir of a storage $S_I$ containing constituents selected from the group formed by the crystallization agents, the additives and the buffers. The solution $S_I$ may contain different constituents but also identical constituents, optionally at different concentrations;
  a channel, a so-called <<addition channel>> which connects the plurality of the secondary channels to the reservoir, so as to add in the reservoir, the constituents selected from the group formed by crystallization agents, additives and buffers of the solutions $S_I$,
  a channel, a so-called <<sampling channel>> in which circulates all or part of the solution S2 which was sampled from the reservoir.

Thus, during crystallization, the composition of the solution S2 changes over time, since it results:
  from the mixture of the solutions $S_I$ which were added in a controlled and adjusted way into the reservoir of the crystallization cell, but also
  from the sampling of all or part of the solution S2.

During crystallization, the composition and solution S2 contained in the reservoir of the crystallization cell may conveniently vary (or in other words be adjusted) depending on the required amounts of crystallization agents and/or additives as the crystallization proceeds. It may therefore change during crystallization and this reversibly, because of the diffusion through the dialysis membrane of the constituents of the solution S2.

Advantageously, the multichannel peristaltic pump is equipped with a specially developed piece of software for allowing the operator to specify the nature and the concentration of the required crystallization agents, additives and buffers, and therefore to produce the suitable mixtures from the different solutions $S_I$ in order to obtain the solution S2 which he/she wishes to have available at a given instant of the crystallization in the reservoir of the crystallization cell. The software may also be designed so as to allow the operator to specify the pH of the crystallization solution S2.

Preferably, the image acquisition means consists in a video microscope.

In an advantageous embodiment of the invention, the image acquisition means includes:
- a video microscope,
- a digital camera,
- a computer equipped with a piece of software allowing processing of the images acquired by a video camera.

In another embodiment of the invention, the image acquisition means includes an optical microscope and a still camera or a video camera.

Other means for controlling the crystallization in the crystallization cell may be contemplated. These are for example laser techniques, turbidity measurements, interferometers, diffractometry, ultrasound imaging, scintillation, polarization, strioscopy, ellipsometry, Raman spectrography, holography.

The crystallization chamber may be made in stainless steel, glass or quartz.

The crystallization device may further comprise at least one means for controlling and varying the temperature of the crystallization device.

In an embodiment of the invention, the means for controlling and varying the temperature is based on Peltier technology. This may be a Peltier effect cell (PEC), also called a thermoelectric module.

The crystallization device may comprise at least one means for measuring the concentration of the molecule to be crystallized in the solution S1.

The crystallization device may also comprise at least one means for characterizing the molecule to be crystallized in terms of size/mass and of the distribution of the sizes of particles of the molecule to be crystallized being formed/diffusing into the solution S1.

Preferably, the crystallization device further comprises a system for measuring the UV absorbance and a system for scattering light in the crystallization chamber. By measuring the UV absorbance, it is possible to determine the solubility curve as defined hereinbefore.

Scattering of light characterizes the size/mass ratio and the distribution of the sizes of particles of the molecules to be crystallized being formed and/or diffusing into the solution S1. Nucleation may thus be detected and the upper limit of the metastable zone (i.e. the line between zone A and zone C of the phase diagrams of figures: FIG. 1a and FIG. 1b) may be identified. In this embodiment, the optical bottom of the crystallization cell is preferably in quartz.

In an embodiment of the invention, the crystallization device further comprises a micromanipulator allowing extraction of the crystals from the crystallization cell.

In an embodiment of the invention which may be contemplated, the crystallization device includes a plurality of crystallization cells which are placed on a semi-automated carousel.

The dialysis membrane may be:
- in cellulose (for example in cuprophane, i.e. regenerated cellulose), in modified cellulose such as cellulose acetate, hemophane, or further in synthetically modified cellulose,
- a synthetic membrane, for example in polysulfone, in polyamide polyacrylonitrile, in copolymers of acrylonitrile and of sodium methallyl sulfonate, in polymethylmethacrylate (PMMA), in ethylene vinyl alcohol (EVOH) or further polycarbonate (PC).

A cellulose membrane has the following properties: fineness, small diameter pores allowing removal of low molecular weight substances, low cost, strong chemical reactivity (because of the hydroxyl groups), low biocompatibility.

The modified cellulose has the following properties: lesser chemical reactivity, good biocompatibility, substitution of the hydroxyl groups, increase in the size of the pores, increase in the hydraulic permeability, removal of substances with greater molecular weight.

The synthetic membranes have the following properties: low chemical reactivity (since they are without any hydroxyl groups), good biocompatibility, large pore size, hydraulic permeability, removal of substances with significant molecular weight.

Preferably, the optical bottom of the crystallization cell is in polycarbonate. It may also be in glass or in quartz.

The cavity made in the crystallization chamber has a volume advantageously comprised between 5 and 200 µL.

According to a preferred embodiment of the invention, the reservoir of the crystallization cell of the crystallization device as described above comprises a plug, equipped with an optical window, which is attached to the end opposite the dialysis membrane. The plug advantageously comprises a gasket intended to hermetically seal the reservoir.

According to a preferred embodiment of the invention, the crystallization cell of the crystallization device as described above, further comprises an overchamber laid out so as to be attached between the crystallization chamber and the reservoir and on which is placed the dialysis membrane. Advantageously, the reservoir is screwed onto the overchamber. Further, the overchamber may be equipped with a gasket for hermetically sealing the overchamber on the crystallization chamber.

This embodiment of the crystallization cell broken down into three portions (the crystallization chamber, the overchamber and the reservoir) forms another object of the invention.

More specifically, the invention relates to a crystallization cell comprising:
- a crystallization chamber, in which a cavity is made, intended to receive a first solution S1 containing the molecule to be crystallized and its crystal seeds, and optionally at least one buffer, the cavity including an optical bottom and an aperture facing the optical bottom,
- a dialysis membrane intended to cover the aperture of the cavity of the crystallization chamber,
- a reservoir intended to be fitted onto the crystallization chamber so as to create a sealed compartment formed by the reservoir on the one hand and by the crystallization chamber on the other hand, the compartment being intended to be filled with a second solution S2, a so-called crystallization solution which contains constituents selected from the group formed by crystallization agents, additives and buffers, which is characterized in that the crystallization cell further comprises an overchamber laid out so as to be attached between the crystallization chamber and the reservoir and on which the dialysis membrane is placed. The reservoir may comprise a plug equipped with an optical window which is attached to the end opposite to the dialysis membrane.

This configuration in three portions of the crystallization cell has the advantage of that the crystals may be easily recovered at the end of the crystallization.

Indeed, once the crystals have formed, the crystallization solution S2 is removed, for example by suction by means of a peristaltic pump. The reservoir is then unscrewed. The overchamber remains assembled to the crystallization chamber so as to preserve the crystals against any mechanical damage or drying. The dialysis membrane is then cut out, for example with a scalpel, and the crystals are easily recovered by means of a nylon crystallographic loop.

The invention also relates to the use of the device for crystallizing a molecule to be crystallized as described above for the crystallization of molecules of several thousand daltons to several hundred thousand daltons. These may be sequences of DNA or RNA nucleic acids, of virus fragments, of proteins, of protein complexes, of protein-RNA complexes, of protein-ligand complexes, or further of polypeptides.

The invention also relates to a crystallization method which is carried out by means of the crystallization device as described above.

According to a first embodiment of the crystallization method, the concentration P of crystallization agents and/or additives remains constant and one resorts to the phase diagram of the molecule to be crystallized established according to the concentration of said molecule to be crystallized and to the temperature as illustrated in FIG. 1a.

More specifically, the method for crystallizing a molecule to be crystallized according to this first embodiment comprises the following steps:

a) one has:
  a first solution S1 of said molecule to be crystallized in the crystallization chamber of a crystallization cell of a crystallization device as described above, and this at a first temperature T1 and at a concentration C1 of the molecule to be crystallized in the solution S1, so that the molecule to be crystallized is found in the spontaneous nucleation zone or on the upper limit of the metastable zone of the phase diagram of said molecule to be crystallized established according to the parameters of the concentration of the molecule to be crystallized and according to the temperature;
  a second solution S2, a so-called crystallization solution, in the compartment of the crystallization cell, said crystallization solution S2 containing at least one crystallization agent and/or one additive at a constant concentration P,
so that the crystallization agent and/or the additive diffuses into the solution S1 and so that seeds of the molecule to be crystallized appear.

b) one increases the temperature of the crystallization cell to a temperature T2 so that nucleation is stopped and the molecule to be crystallized is found in the metastable zone of the phase diagram of the molecule to be crystallized.

c) one lets the crystal seeds grow at temperature T2 until a first equilibrium point E1 is obtained (as appearing in FIG. 1a), where the size of the crystals remains constant, the concentration of the molecule to be crystallized in the solution S1 which is reached, then being the concentration C2.

d) one lowers the temperature of the crystallization chamber to a temperature T3, so that the crystals present in the crystallization chamber are always located in the metastable zone of the phase diagram of the molecule to be crystallized.

e) one lets the seeds of crystals and the crystals grow at temperature T3 until a second equilibrium point E2 is obtained (as appearing in FIG. 1a) where the size of the crystals remains constant, the concentration of the molecule to be crystallized in the solution S1 which is reached, is then the concentration C3.

f) one repeats the steps c) to e) until crystals of the desired size of the molecule to be crystallized are obtained.

g) one recovers the crystals obtained at the end of step f).

FIG. 1a represents the embodiment of the method according to the invention wherein in step a), the molecule to be crystallized is found on the upper limit of the metastable zone of the phase diagram of said molecule to be crystallized established according to the parameters of the temperature and of the concentration of the molecule to be crystallized.

In step f), by desired size is meant a size of the order of 0.1 mm if the crystals are intended for X-ray crystallography, and of the order of 1.0 mm if the crystals are intended for neutron crystallography.

The crystals are easily recovered in step g) of the method according to the invention, because the crystallization solution S2, as well as the reservoir of the crystallization cell, are easily removed. Next, with a surgical scalpel, a cut may be made on the membrane following the aperture of the crystallization chamber in order to remove it by means of pliers.

In this way, the mechanical perturbations of the sample containing the molecules to be crystallized are minimized. Next, the crystals are directly mounted in loops of suitable sizes in fiber conventionally used in crystallography. All this procedure may be carried out while viewing the crystallization cell under an optical microscope which the crystallization device according to the invention may comprise.

According to a second embodiment of the crystallization method, the temperature T of the crystallization cell is maintained constant and one resorts to the phase diagram of the molecule to be crystallized established according to the concentration of said molecule to be crystallized and to the concentration of crystallization agents and/or additives, as illustrated in FIG. 1b.

More specifically, the method for crystallization of a molecule to be crystallized according to this second embodiment comprises the following steps:

a) One has:
  a first solution S1 of said molecule to be crystallized in the crystallization chamber of a crystallization cell of a crystallization device as described above, and this at a constant temperature T of the crystallization cell and at a concentration C1 of the molecule to be crystallized, so that the molecule to be crystallized is found in the spontaneous nucleation zone or on the upper limit of metastable zone of the phase diagram of said molecule to be crystallized, established according to the parameters of the concentration of the molecule to be crystallized and to the crystallization agent and/or additive concentration;
  a second solution S2, a so-called crystallization solution containing at least one crystallization agent and/or one additive at the concentration P1 in the compartment of the crystallization cell,
so that the crystallization agent and/or the additive diffuses into the solution S1, so that seeds of the molecule to be crystallized appear.

b) One lowers the concentration of the crystallization agent and/or of the additive to a concentration P2, so that nucleation is stopped and the molecule to be crystallized is found in the metastable zone of said phase diagram of the molecule to be crystallized.

c) One lets the seeds of crystals grow at the concentration P2 of the crystallization agent and/or of the additive until a first equilibrium point E1 is obtained (such as appearing in FIG. 1b), where the size of the crystals remains constant, the concentration of the molecule to be crystallized in the solution S1 which is reached, is then the concentration C2.

d) One increases the concentration of the crystallization agent and/or of the additive to a concentration P3, so that the crystals present in the crystallization chamber are always located in the metastable zone of said phase diagram of the molecule to be crystallized.

e) One lets the seeds of crystals and the crystals grow at the concentration P3 of the crystallization agent and/or of the additive until a second equilibrium point E2 is obtained (such as appearing in FIG. 1b) where the size of the crystals remains constant, the concentration of the molecule to be crystallized in the solution S1 which is reached, is the concentration C3.

f) One repeats steps c) to e) until crystals of the desired size of the molecule to be crystallized are obtained.

g) One recovers the crystals obtained at the end of step f).

FIG. 1b represents the embodiment of the method according to the invention in which in step a), the molecule to be crystallized is found on the upper limit of the metastable zone of the phase diagram of said molecule to be crystallized, established according to the parameters of the concentration of the molecule to be crystallized and of the crystallization agent and/or additive concentration.

In step f), by desired size is meant a size of the order of 0.1 mm if the crystals are intended for X-ray crystallography and of the order of 1.0 mm if the crystals are intended for neutron crystallography.

According to a third embodiment of the crystallization method, one resorts to a phase diagram of the molecule to be crystallized established according to:
the concentration of said molecule to be crystallized,
the concentration of crystallization agents and/or additives, and
the temperature.

This phase diagram is therefore a three-dimensional diagram.

Thus, according to this third embodiment, it is possible to act simultaneously on the parameters of temperature and of concentrations of crystallization agents and/or additives.

The conditions of the crystallization method according to this third embodiment are the same as the ones detailed for the first and the second embodiments of the method, with the difference that one acts simultaneously on both aforementioned parameters.

Thus, in step a) of the crystallization method according to this third embodiment, the molecule to be crystallized is found in the spontaneous nucleation zone of the phase diagram in three dimensions.

Next, in order to control the ordered growth of the crystals, conditions are sought, giving the possibility of being located in the metastable zone of this three-dimensional phase diagram.

Further, the knowledge of the phase diagram and the specific control of the crystallization parameters such as the temperature and the concentration of crystallization agents and/or additives as described in the present invention give the possibility during the crystallization method according to the invention, of reducing the number of crystals and their macroscopic defects, as well as of selecting the nucleation and/or growth of the desired phase.

Further, the crystallization method according to the invention has the advantage of being able to induce the following physical phenomena:
kinetic ripening,
phase transition.

If, in a solution of a molecule to be crystallized, there are several crystals of the same phase and if they were formed at different instants, they have different sizes.

At room temperature, a small crystal has greater solubility than a large crystal. The consequence of Ostwald ripening (isothermal phenomenon) lies in the fact that over time (several weeks or months), the small crystals disappear to the benefit of large crystals. If controlled fluctuations of temperature and/or of concentration of crystallization agent and/or additive are imposed, kinetic ripening is set up and causes faster disappearance of the smallest crystals.

The same applies for the macroscopic defects of the crystals such as satellite crystals bonded onto single crystals. By inducing controlled fluctuations of temperature and/or of concentration of crystallization agents and/or additives, these satellites may be completely dissolved to the benefit of the growth of large single crystals.

The controlled fluctuations of temperature and/or of concentration of crystallization agents and/or additives may also be at the origin of the transition phenomenon of the phases (disappearance of one phase to the benefit of another phase). These phases may be polymorphs, solvates, microcrystalline solids of other phases and amorphous liquids.

Advantageously, the molecule to be crystallized is selected from sequences of DNA or RNA nucleic acids, virus fragments, proteins, protein complexes, protein-RNA complexes, protein-ligand complexes, or further polypeptides.

As examples of proteins crystallized within the scope of the invention, mention may be made of inorganic yeast pyrophosphatase and urate oxidase of *Aspergillus flavus* which may be co-crystallized in the presence of various inhibitors such as 8-azaxanthine, 9-methyl uric acid, 8-nitroxanthine, as well as its natural substrate: uric acid.

As example, the inorganic yeast pyrophosphatase is solubilized in a buffer: MES, at a concentration of 30 mM. This allows a pH of the crystallization solution to be maintained at 6. The crystallization solution S2 is a solution comprising 15% of MPD, and 0.5 mM of $NaH_2PO_4$, 1 mM of $MnCl_2$, and 30 mM of MES buffer at pH 6.

As another example, urate oxidase is solubilized in the Tris buffer at a concentration of 100 mM, so as to have a pH of 8.5. The solution S2 is a solution comprising 5% of PEG 8000, 100 mM of NaCl, and 10 mM of Tris buffer at pH 8.5.

The crystallization method according to the invention has all its benefit not only in fundamental research, but also because the three-dimensional structures of biological macromolecules particularly those of proteins are crucial for developing novel pharmaceutical compounds.

Indeed, many targets of drugs are integral membrane proteins which are experimentally particularly demanding. With such targets which are difficult to produce, the existing crystallization automation methods are often inefficient.

By the crystallization method according to the invention, it is possible to <<shape>> the size of the crystal, its diffraction quality and its crystalline phase while significantly reducing the time, the effort and the required amount of molecules to be crystallized for the determination of its structure.

The time-dependent change in the size of the crystals is measured by means of the image acquisition device, for example by taking photographs of the crystals approximately every 20 to 30 minutes when the growth of the crystal begins, and then every 2 to 3 hours when it is on the point of ending. The photographs may be analyzed by means of a specially adapted image analysis software package.

It should be noted that the whole of the steps of the crystallization method as described above may be spread over a time period attaining two months, in particular if it desired to have large volumes of crystals of the molecules to be crystallized which are required in neutron crystallography of proteins.

For X-ray crystallography, a time period from 1 to 2 weeks is sufficient.

Also, the selection of the temperatures during these steps depends on the nature of the molecules to be crystallized and on their thermal stability.

As an example, the crystallization of proteins is a very delicate process which depends on a large number of environmental variables (for example the concentration of the protein and of crystallization agents, the temperature, the pH) and on kinetic factors which are difficult to control.

In the case of urate oxidase, the optimum range of temperature is comprised between 5° C. and 28° C. Above 28° C. (for example at 30° C.) the protein does not remain stable for a sufficient amount of time and begins to degrade.

Thus, the crystallization method according to the invention is perfectly adapted for the crystallization of highly diversified molecules, i.e. both for molecules of significant molecular weight and for molecules of low molecular weight, such as pharmaceutical compounds.

The invention will be better understood by means of the detailed description which is discussed below with reference to the appended drawings.

FIG. 2b illustrates a schematic perspective view of the crystallization cell illustrated in FIG. 2a.

FIG. 3b illustrates a schematic side view of the crystallization device illustrated in FIG. 3a.

Figure 2A:
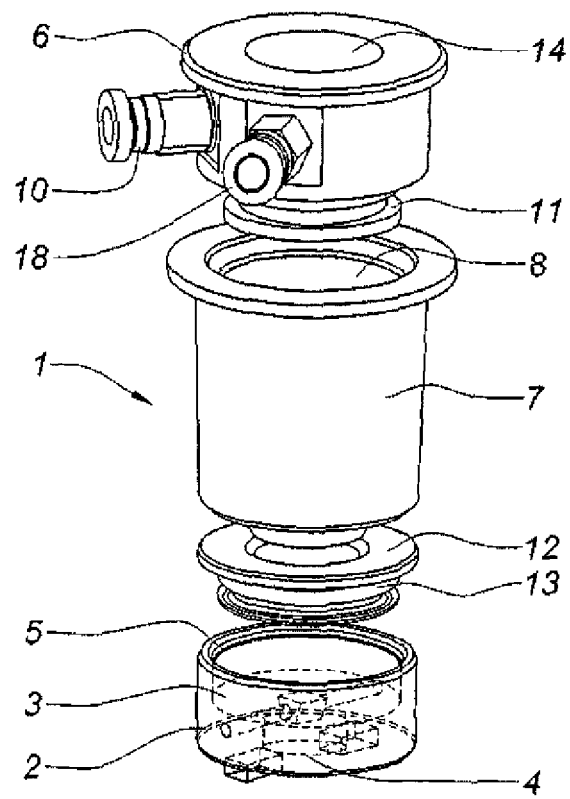
FIG. 2a illustrates an exploded and perspective schematic view of a crystallization cell according to the invention.
Figure 2B:
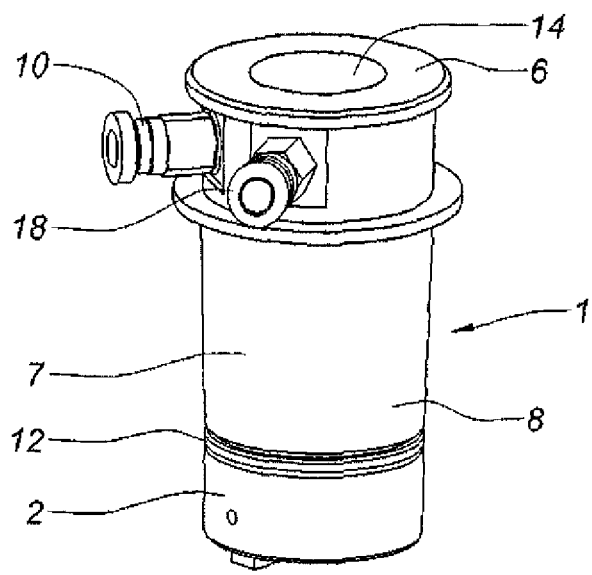

In FIGS. 2a and 2b is illustrated a crystallization cell 1 according to the invention. This crystallization cell 1 comprises:
- a crystallization chamber 2, in which a cavity 3 is made intended to receive a first solution S1 of the molecule to be crystallized. The cavity 3 includes an optical bottom 4 and an aperture 5 facing the optical bottom 4.
- a dialysis membrane (not visible) intended to cover the aperture 5 of the cavity 3 of the crystallization chamber 2.
- a reservoir 7 intended to be fitted onto the crystallization chamber 2 so as to create a sealed compartment 8 formed by the reservoir 7 on the one hand and by the crystallization chamber 2 on the other hand, the compartment 8 being filled with a second solution S2, a so-called crystallization solution,
- an overchamber 12 equipped with a gasket 13,
- a plug 6 equipped with an optical window 14, with a gasket 11, with a first end piece 10 and a second end piece 18 respectively intended to be connected to an additional channel and to a sampling channel of a peristaltic pump not shown in FIGS. 2a and 2b.

The dialysis membrane is held into place on the crystallization chamber 2 by means of an overchamber 12 and of a gasket 13. Indeed, the dialysis membrane was placed on the overchamber 12 by means of the gasket 13 and the whole was then placed on the crystallization chamber 2.

The molecule to be crystallized present in the crystallization solution S1 does not diffuse through the dialysis membrane.

By an osmosis and molecular agitation effect, the crystallization agents, the additives and the buffers of the crystallization solution S2 cross the dialysis membrane, while the crystallized molecules of the crystallization solution S1 are retained in the crystallization chamber 2.

An osmotic equilibrium is established on either side of the dialysis membrane between the compounds present in the crystallization solution S2 and the compounds present in the solution S1 which consist in not only the molecule to be crystallized but also in the aforementioned crystallization agents and additives as well as the buffers which have diffused through the dialysis membrane.

Figure 1A:
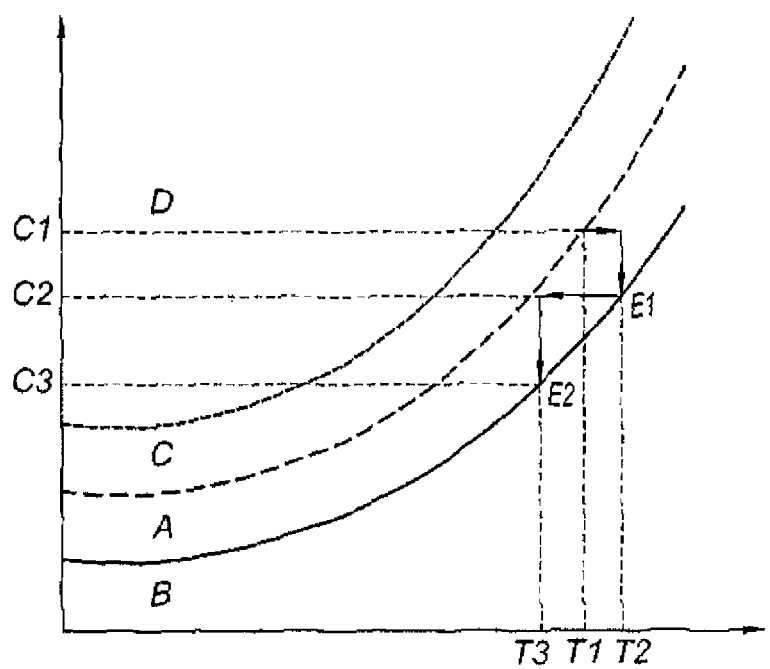
FIG. 1a illustrates a phase diagram of a molecule to be crystallized, established according to parameters of the concentration of the molecule to be crystallized and to the temperature. Here, this is a protein with direct solubility.
Figure 1B:
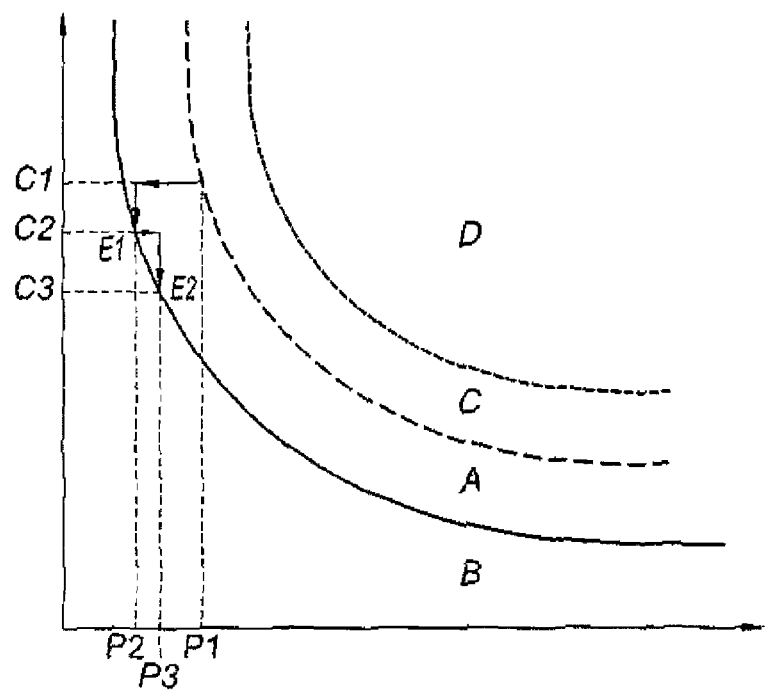
FIG. 1b illustrates a phase diagram of a molecule to be crystallized, established according to parameters of the concentration of the molecule to be crystallized and the crystallization agent and/or additive concentration.

Further, the diffusion of the crystallization agents, of the additives and of the buffers of the solution S2 through the dialysis membrane gives the possibility of obtaining in a controlled way crystals of the molecule to be crystallized, since, by this controlled diffusion, the crystals present in the solution S1 may be located at the boundary between the C and A zones of the phase diagrams as illustrated in FIGS. 1a and 1b.

Thus, the crystallization method according to the invention gives the possibility of controlling both spontaneous nucleation while being located at the upper limit of the metastable zone, and growth of the crystals while being located in the metastable zone.

The dialysis membrane provides the advantage to the crystallization cell 1 of that it is easily possible to vary and in a reversible way, the constituents of the solution S1, because of the possibility of reversible diffusion of the crystallization agents, of the additives and of the buffers of the solution S2 through the dialysis membrane, and this easily by adding crystallization agents, additives and buffers and/or while sampling all or part of the crystallization solution S2 gradually during the method for crystallizing the molecule to be crystallized, more specifically under optimum crystallization conditions (i.e. causing nucleation and/or growth of crystals) which are determined by means of the phase diagrams of the molecule to be crystallized such as for example as illustrated in FIGS. 1a and 1b.

Thus, by means of the crystallization cell 1, it is possible to easily study any concentration combination of the constituents of the crystallization solution S2, of the temperature, so that the amount of the molecule to be crystallized in solution S1 may remain constant throughout the crystallization.

The crystallization cell 1 gives the possibility of exploring the multitude of crystallization conditions with the same sample of a molecule to be crystallized. This provides the advantage of obtaining crystals of the desired size, diffraction quality and crystalline phase, and this economically (in particular for the hardware) and with a considerable gain in time as compared with present techniques.

The crystals of the solution S1 are actually permanently exposed to optimum crystallization conditions by continuously supplying constituents of the crystallization solution S2 through the dialysis membrane.

Figure 3A:
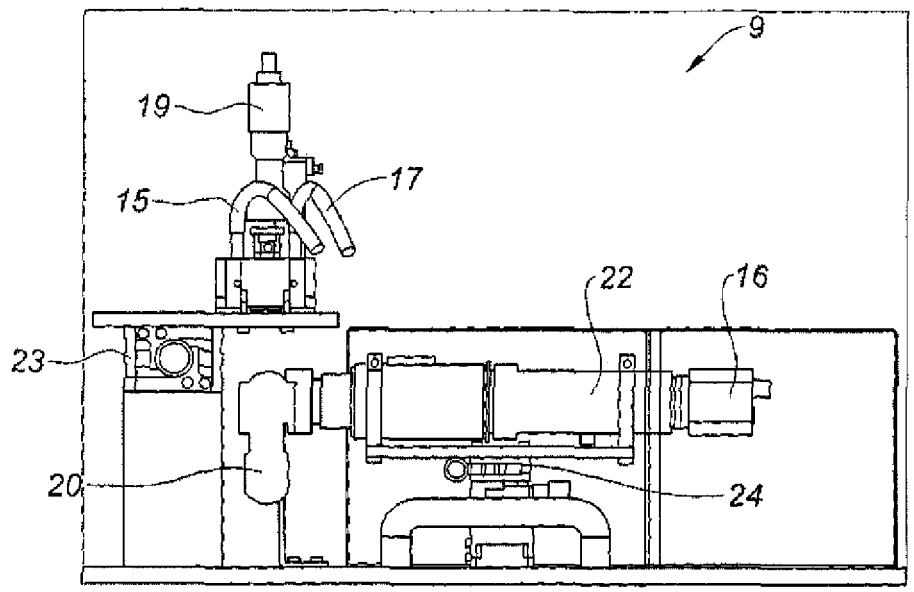
FIG. 3a illustrates a schematic front view of a crystallization device according to the invention.
Figure 3B:
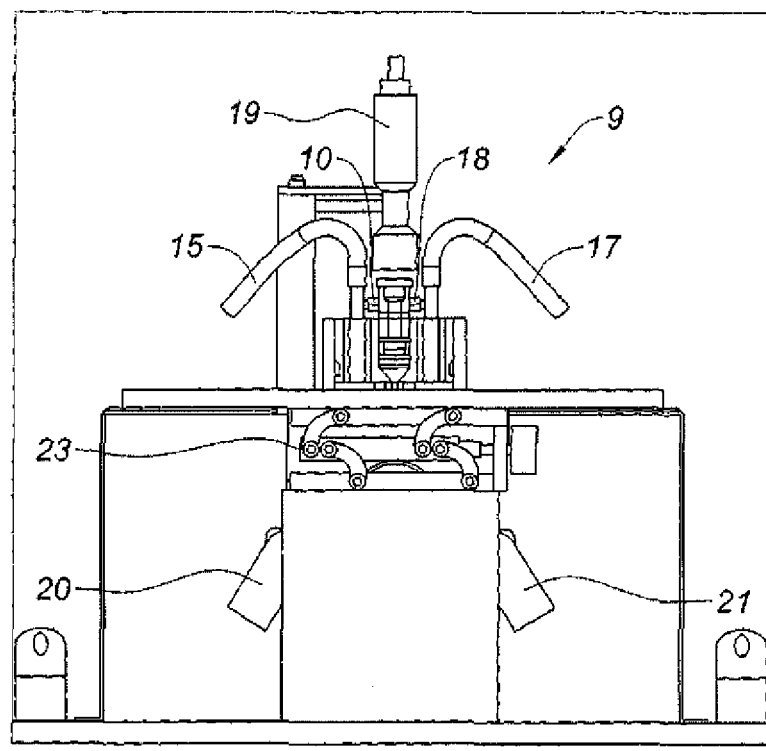

In FIGS. 3a and 3b is illustrated a crystallization device 9 according to the invention which comprises:
- a video microscope 22,
- a digital color camera 16 which is connected to a computer (not shown),
- supports 23, 24,
- light-emitting diodes 19, 20, 21.

The inlet endpiece 10 of the plug 6 is connected to an inlet channel 15 of a peristaltic pump (not shown). This gives the possibility of adding to the solution S2 in the reservoir 7, constituents selected from the group formed by crystallization agents, additives and buffers. The outlet endpiece 18 of the plug 6 is connected to an outlet channel 17 of the peristaltic pump (not shown). This gives the possibility of sampling all or part of the solution S2 in the reservoir 7.

The invention claimed is:

1. A device for crystallization of a molecule, comprising:
   at least one crystallization cell, the crystallization cell comprising:
   a crystallization chamber that includes an optical bottom, an aperture facing the optical bottom, and a cavity into which the aperture opens, the cavity being configured to receive a first solution S1 comprising the molecule to be crystallized and its crystal seeds, and optionally at least one buffer,
   a dialysis membrane configured to cover the aperture of the cavity of the crystallization chamber,
   a reservoir configured to be fitted on top of the crystallization chamber, so as to create a sealed compartment formed by the reservoir and the crystallization chamber, the compartment being configured to be filled with a second solution S2 comprising constituents selected from the group consisting of crystallization agents, additives and buffers,
   at least one image acquisition means, and
   at least one addition means configured to add the constituents to the solution S2 in the reservoir,
   and/or
   at least one sampling means configured to sample all or part of the solution S2 in the reservoir.

2. The crystallization device according to claim 1, comprising the addition means, wherein the addition means includes a driving means configured to add the constituents to the solution S2.

3. The crystallization device according to claim 1, comprising the sampling means, wherein the sampling means includes a driving means configured to sample all or part of the solution S2 in the reservoir.

4. The crystallization device according to claim 1, wherein the addition means and the sampling means include a multi-channel peristaltic pump.

5. The crystallization device according to claim 1, further comprising at least one means for controlling and varying the temperature of the crystallization device.

6. The crystallization device according to claim 5, wherein the means for controlling and varying the temperature is a Peltier effect cell.

7. The crystallization device according to claim 1, further comprising at least one means for measuring the concentration of the molecule to be crystallized in the solution S1.

8. The crystallization device according to claim 1, further comprising an overchamber configured to be attached between the crystallization chamber and the reservoir and on which the dialysis membrane is placed.

9. The crystallization device according to claim 1, further comprising a plug configured to fit on top of the reservoir, the plug equipped with an optical window, which is attached to an end opposite to the dialysis membrane.

10. The crystallization device according to claim 1, wherein the dialysis membrane is a cellulose membrane or a synthetic membrane.

11. The crystallization device according to claim 1, wherein the optical bottom is made of polycarbonate, quartz or glass.

12. A crystallization cell comprising:
    a crystallization chamber that includes an optical bottom, an aperture facing the optical bottom, and a cavity into which the aperture opens, the cavity being configured to receive a first solution S1 comprising a molecule to be crystallized and its crystal seeds, and optionally at least one buffer,
    a dialysis membrane configured to cover the aperture of the cavity of the crystallization chamber,
    a reservoir configured to be fitted on top of the crystallization chamber, so as to create a sealed compartment formed by the reservoir and the crystallization chamber, the compartment being configured to be filled with a second solution S2 comprising constituents selected from the group consisting of crystallization agents, additives and buffers, and
    an overchamber configured to be attached between the crystallization chamber and the reservoir and on which is placed the dialysis membrane.

13. The crystallization cell according to claim 12, further comprising a plug configured to fit on top of the reservoir, the plug equipped with an optical window which is attached to an opposite end of the dialysis membrane.

14. A method for crystallization of a molecule, comprising the following steps:
    a) providing:
       a first solution S1 of said molecule to be crystallized in the crystallization chamber of the crystallization cell of the crystallization device according to claim 1 at a first temperature T1 and at a concentration C1 of the molecule in the solution S1, so that the molecule is found in the spontaneous nucleation zone or on an upper limit of a metastable zone of a phase diagram of said molecule, established according to the concentration of the molecule and to the temperature;
       a second solution S2, in the compartment of the crystallization cell, said second solution S2 comprising at least one crystallization agent and/or one additive at a constant concentration P,
    so that the crystallization agent and/or the additive diffuses into the solution S1 and so that seeds of the molecule appear,
    b) increasing the temperature of the crystallization cell to a temperature T2 so that nucleation is stopped and the molecule is found in the metastable zone of the phase diagram of the molecule,
    c) allowing the seeds of crystals to grow at the temperature T2 until a first equilibrium point E1 is obtained, where a size of the crystals remains constant, the concentration of the molecule in the solution S1 reaching a concentration C2,
    d) lowering the temperature of the crystallization chamber to a temperature T3, so that the crystals present in the crystallization chamber are always located in the metastable zone of the phase diagram of the molecule,
    e) allowing the crystals to grow at the temperature T3 until a second equilibrium point E2 is obtained where the size of the crystals remain constant, the concentration of the molecule in the solution S2 reaching a concentration C3,
    f) repeating the steps c) to e) until crystals of a desired size of the molecule are obtained,
    g) recovering the crystals obtained after step f).

15. A method for crystallization of a molecule, comprising the following steps:
    a) providing:
       a first solution S1 of said molecule to be crystallized in the crystallization chamber of the crystallization cell of the crystallization device according to claim 1, at a constant temperature T of the crystallization cell and at a concentration C1, so that the molecule is found in a spontaneous nucleation zone or on an upper limit of a metastable zone of a phase diagram of said molecule, established according to the concentration of the molecule and a concentration of a crystallization agent and/or additive;

a second solution S2 comprising at least one of the crystallization agent and/or additive at a concentration P1 in the compartment of the crystallization cell, so that the crystallization agent and/or the additive diffuses into the solution S1, so that seeds of the molecule appear, b) diluting the concentration of the crystallization agent and/or of the additive to a concentration P2, so that nucleation is stopped and the molecule is found in the metastable zone of said phase diagram of the molecule, c) allowing the seeds of crystals to grow at the concentration P2 of the crystallization agent and/or of the additive until a first equilibrium point E1 is obtained, where a size of the crystal remains constant, the concentration of the molecule in the solution S1 reaching a concentration C2, d) increasing the concentration of the crystallization agent and/or of the additive to a concentration P3, so that the crystals present in the crystallization chamber are always located in the metastable zone of said phase diagram of the molecule, e) allowing the seeds of crystals and crystals to grow at the concentration P3 of the crystallization agent and/or of the additive until a second equilibrium point E2 is obtained where the size of the crystals remains constant, the concentration of the molecule in solution S1 reaching a concentration C3, f) repeating the steps c) to e) until crystals of a desired size of the molecule are obtained, g) recovering the crystals obtained after step f).

16. The crystallization device according to claim 1, further comprising a plug equipped with an optical window, a gasket, and a first end piece, and a second end piece, wherein the first and second end pieces are configured to respectively connect to the addition means and the sampling means.

17. The crystallization cell according to claim 12, further comprising a plug equipped with an optical window, a gasket, and a first end piece, and a second end piece, wherein the first and second end pieces are configured to respectively connect to an addition channel and to a sampling channel of a peristaltic pump.

18. The crystallization device according to claim 1, wherein the addition means and the sampling means are further configured to gradually add the constituents and sample all or part of the solution S2, respectively, without having to unseal the compartment.

* * * * *